(12) United States Patent
Bauer et al.

(10) Patent No.: US 7,709,379 B2
(45) Date of Patent: May 4, 2010

(54) ELECTRICAL DEVICE COMPRISING CONDUCTORS MADE OF CARBONIZED PLASTIC, AND METHOD AND APPARATUS FOR THE PRODUCTION THEREOF

(75) Inventors: Michael Bauer, Nittendorf (DE); Thomas Bemmerl, Schwandorf (DE); Markus Fink, Zell (DE); Edward Fuergut, Dasing (DE); Horst Groeninger, Maxhutte-Haidhof (DE); Hermann Vilsmeier, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 780 days.

(21) Appl. No.: 10/555,632

(22) PCT Filed: May 4, 2004

(86) PCT No.: PCT/DE2004/000935

§ 371 (c)(1),
(2), (4) Date: Jan. 15, 2007

(87) PCT Pub. No.: WO2004/100628

PCT Pub. Date: Nov. 18, 2004

(65) Prior Publication Data

US 2007/0113305 A1 May 17, 2007

(30) Foreign Application Priority Data

May 5, 2003 (DE) ................ 103 20 090

(51) Int. Cl.
*H01L 21/44* (2006.01)

(52) U.S. Cl. .............. 438/662; 438/610; 977/773; 257/E21.324; 257/E21.347

(58) Field of Classification Search ............. 438/610, 438/662; 257/E21.324, E21.347; 977/773
See application file for complete search history.

(56) References Cited

U.S. PATENT DOCUMENTS

| 3,390,012 | A |  | 6/1968 | Haberect |
|---|---|---|---|---|
| 4,694,138 | A |  | 9/1987 | Oodaira et al. |
| 4,822,973 | A | * | 4/1989 | Fahner et al. ............ 219/121.6 |
| 5,349,746 | A | * | 9/1994 | Gruenwald et al. ........... 29/620 |
| 2006/0001726 | A1 | * | 1/2006 | Kodas et al. ................ 347/105 |
| 2006/0250781 | A1 | * | 11/2006 | Bauer et al. ................. 361/779 |

FOREIGN PATENT DOCUMENTS

DE     0 230 128     7/1987

(Continued)

OTHER PUBLICATIONS

H-K Roth et al.: "Laser recording of circuit structures from conducting polymers in insulating polymer layers", Circuit World, 1996, pp. 31-32.

(Continued)

*Primary Examiner*—Alexander G Ghyka
*Assistant Examiner*—Seahvosh J Nikmanesh
(74) *Attorney, Agent, or Firm*—Dicke, Billig & Czaja, PLLC

(57) ABSTRACT

An electrical device having carbonized conductors and a method and a device for the production thereof is disclosed. The electrical device has electrical components having connections. Furthermore, there are situated between the electrical components regions made of plastic with conductors having carbonized plastic and/or agglomerated nanoparticles. The conductors are connected to the connections of the components and/or to external connections of the electronic device.

6 Claims, 4 Drawing Sheets

FOREIGN PATENT DOCUMENTS

| | | |
|---|---|---|
| DE | 197 15 898 | 10/1998 |
| DE | 102 06 818 | 8/2003 |
| EP | 230 128 | 7/1987 |
| EP | 0288807 | 4/1988 |
| EP | 1 124 264 | 8/2001 |
| JP | 2002008451 | 1/2002 |
| WO | 0248432 | 6/2002 |

OTHER PUBLICATIONS

Banks R H et al.: "Laser Generated Conductive Lines", IBM Technical Disclosure Bulletin, Aug. 1, 1976 (1 pg.).

Banks et al., Laser Generated Conductive Lines, IBM technical Disclosure Bulletin, 1976, vol. 19, No. 3, p. 1014.

* cited by examiner

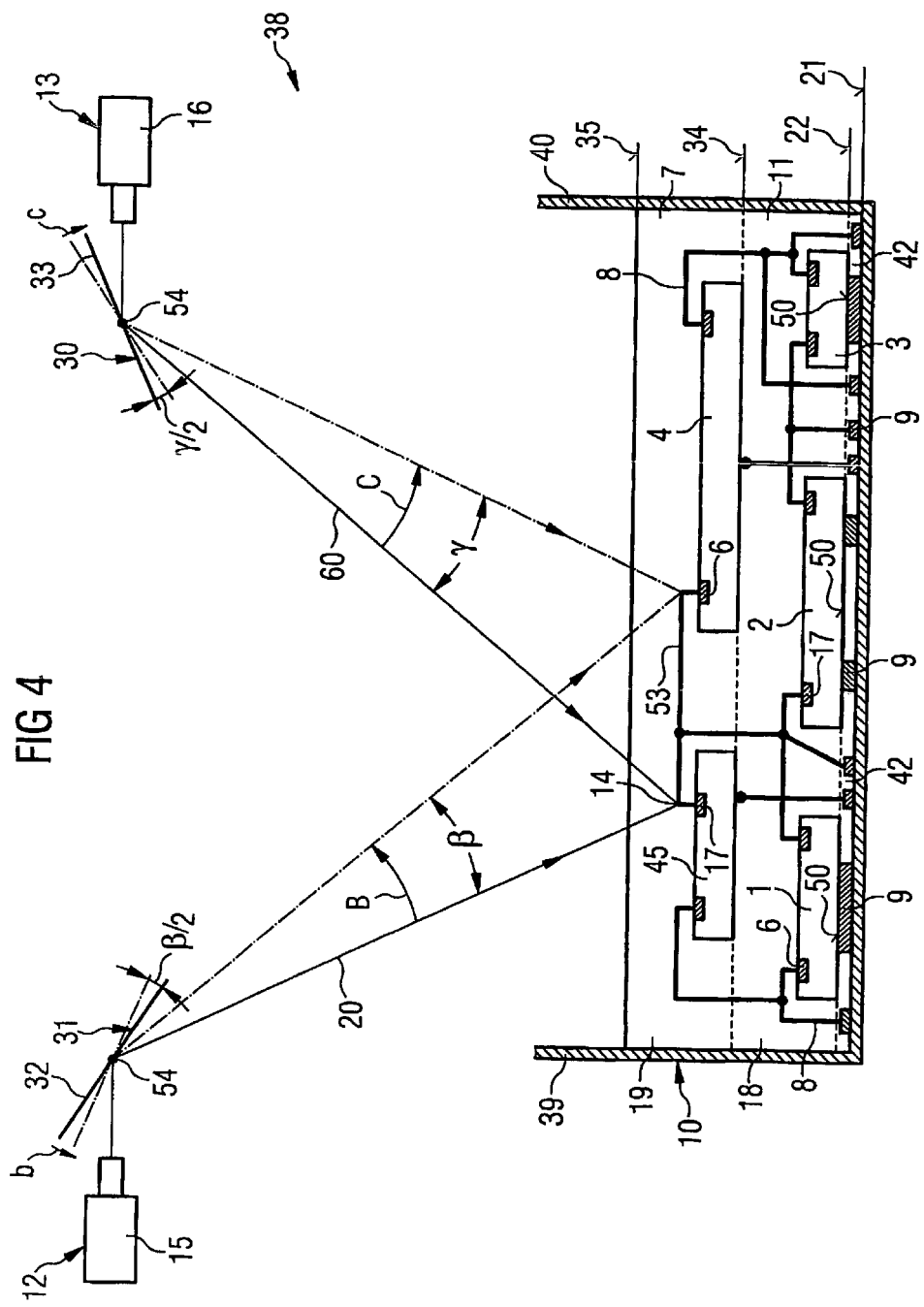

ELECTRICAL DEVICE COMPRISING CONDUCTORS MADE OF CARBONIZED PLASTIC, AND METHOD AND APPARATUS FOR THE PRODUCTION THEREOF

BACKGROUND

The wiring and packaging of electrical components and/or semiconductor chips to form compact electrical devices is extremely complex and costly. Thus, it is necessary to provide external contacts which are to be connected to electrodes of the electrical components and/or to contact areas of semiconductor chips via a plurality of wiring layers or multilayer substrates. Through contacts have to be provided between the wiring layers or in the multilayer substrates in order that the conductor tracks of the different layers are electrically connected to one another via said through contacts. The production of electrical devices constructed in this way is thus complicated and cost-intensive.

SUMMARY

The present invention provides an electrical device that can be produced cost-effectively and also a method and a device for the production of the device.

According to one embodiment of the invention, an electrical device has at least one electrical component having electrical connections. Furthermore, the electrical device has a region made of plastic with conductors having carbonized plastic and/or agglomerated nanoparticles. The conductors are connected to electrical connections and/or to external connections of the electrical device.

One advantage of this electrical device is that it is possible to realize three-dimensional wirings between electrodes to be wired of electrical components and/or contact areas of semiconductor chips with external contacts of the electrical device without complicated rewiring layers or multilayer substrates having to be provided in the electrical device. Rather, the region made of plastic with carbonized conductors may be configured three-dimensionally. Conductors running both vertically and horizontally and conductors at any desired solid angle are possible, with the result that effective and short wiring paths can be realized in the device with the aid of the regions. This means that it is possible to reduce propagation time delays within the electrical device and to plan the conductor routings three-dimensionally and passive, capacitive or inductive components can be incorporated in the region by means of spiral or by means of sheetlike formation of the conductors.

The carbonization of the plastic to form conductors in a region is realized by supplying energy with locally delimited carbonization of the plastic. An orientation and an agglomeration of nanoparticles to form conductors may be effected by application of alternating electromagnetic fields or by means of microwave excitation. Depending on the material of the nanoparticles, such excitations may lead to an anisotropic orientation of the nanoparticles distributed isotropically in the plastic through to the nanoparticles being sintered together to form conductors in the plastic. Furthermore, conductors made of initially unbound nanoparticles or agglomerates of nanoparticles with bridges made of carbonized sections between the agglomerates or the nanoparticles are also provided for the electrical device.

The conduction type which is predominant in the device depends, on the one hand, on the quantity of the addition of nanoparticles and, on the other hand, on the type of energy supply by means of electromagnetic excitation or by means of thermal radiation, and also on the properties of the plastic. The higher the degree of crosslinking of a resin layer surrounding the conductor tracks, the more stably a conductor track routing is possible. For this purpose, the resin layer directly adjoining the conductor may be incipiently cured or cured during carbonization, with the result that the "carbon black conductor" is mechanically stabilized. The transition to the external connections of the electronic device may be achieved by metallizing the ends of the carbonized conductors.

Apparatus for the production of an electrical device including at least one component having electrical connections has a casting mold for the introduction of plastic. At least one electrical component can be inserted into the casting mold. The casting mold may be formed by a shallow vessel, on the flat bottom of which a plurality of electrical components such as passive components and/or semiconductor chips may be arranged before plastic is introduced into the casting mold. In addition to the casting mold, the apparatus has at least one focusable energy source with an orienting mechanism for guiding the focusing region of the energy source in regions of the introduced plastic. Said focusable energy source serves for the formation of conductors of the electrical device to be produced.

Furthermore, the apparatus has a casting device for the continuous or layer-by-layer filling of the casting mold with plastic whilst embedding the components and forming connecting conductors in regions of the plastic.

An apparatus of this type has the advantage that it can be extended as desired if more than one component having electrical connections is to be provided in the electrical device and a corresponding number of regions become necessary between the components for the purpose of interconnecting the connections of the components and for the purpose of connecting the connections to external connections. A further advantage is that a focusable energy source is used in order to convert the plastic into carbonized conductors locally in the region.

For transparent plastics, the focusable energy source has the advantage that conductors arise within the plastic at the focal point if the latter is guided by the orienting mechanism in a predetermined direction for the formation of conductors. For non-transparent plastics, too, a focusable energy source is advantageous on the one hand in order to delimit the local extension of the conductor tracks and, on the other hand, in order to produce a carbonization of the plastic of the surface as far as a depth delimited by the focus.

In addition to the casting mold and the focusable energy source, the apparatus has a casting device for plastic. Said casting device serves for the continuous or layer-by-layer filling of the casting mold with plastic. During the filling or after the filling of a thin layer in each case, connecting conductors are produced in the regions of the plastic with the aid of the focusable energy source. The component having electrical connections is embedded in synthetic resin at the same time and continuously or layer by layer. The focusable energy source may be a laser apparatus with a focusable laser beam, an ultrasonic apparatus with focusable ultrasonic excitation, a microwave apparatus with focusable microwave excitation, or an electron beam or ion beam apparatus.

On account of their high availability and their high precision, laser apparatuses are preferably used for the apparatus for the production of an electronic device including regions or conductors made of carbonized plastic. A high precision is also afforded by electron beam and ion beam installations. Ultrasonic energy sources and microwave apparatuses are particularly suitable if the intention is to realize sheetlike or layered carbonized regions, as are advantageous as capacitor plates for example for passive devices.

One embodiment of the apparatus provides for two energy sources that are spaced apart from one another to be coupled via an optical or mechanical orienting device. In this case, the orienting device is able to superimpose the focusing regions of the focusable energy source within the regions in such a way that the sum of the energy radiated in the focus region locally carbonizes the plastic in order to form conductors. Each individual beam from the energy sources, by contrast, does not bring about any alterations in the plastic. In the case of a transparent plastic, both horizontal and vertical conductors and conductors at any desired spatial angle can thus be realized within a relatively thick region.

In the case of non-transparent plastics, the superimposition of the focusing regions may lead to a carbonization in each case on a surface of the plastic, so that this device is suitable both for transparent plastics and for non-transparent plastics for conductor formation. The control of the orienting mechanism or the control of the energy sources and the control of the focusing regions may be supervised and controlled by means of a microprocessor.

The type of energy source also determines the type of orienting device.

Thus, ion beam and electron beams installations are provided with electro-optical actuators that permit the electron or ion beam to be guided along conductors to be formed. In the case of laser apparatuses especially optical deflection means such as polygonal rotating mirrors and upstream or downstream lens systems have proved worthwhile in order to guide the deflections of a focused laser beam along planned conductors in the region made of plastic.

A method for the production of an electronic device including at least one electrical component having electrical connections is characterized by the following method steps. Firstly, the electrical component is arranged in a casting mold for plastic. Afterward, a plastic is introduced into the casting mold in order to at least partially embed the electrical component in the plastic. Subsequently or synchronously, the method effects a method step of partial carbonization of the plastic and/or partial agglomeration of nanoparticles in the plastic to form conductors in a region. Energy of a focused and guided beam from an energy source is radiated in for this purpose.

A method of this type has the advantage that, between external connections of the electronic device to be produced and connections of the electrical component, it is possible subsequently or simultaneously to produce connecting conductors in the plastic. In an advantageous manner, vertical conductors can thus be realized by virtue of the plastic composition gradually rising in the casting mold and at the same time the focus region of an energy source activating the points at which vertical conductors are intended to arise. For horizontal conductors, the casting process can be interrupted in order to make available a plane for a conductor track layer within regions. Horizontally oriented conductors arise in this case which, on the one hand, can be connected to the vertical conductors or conductors formed at a solid angle. On the other hand, these conductors can be connected to external connections of the electrical device or to connections of the electrical component.

If the plastic is enriched with nanoparticles, then it is possible, with the aid of the energy source, to ensure that the nanoparticles agglomerate to form conductors through sintering of nanoparticles to form conductors. Furthermore, it is advantageously possible to produce electrically conductive bridges made of carbonized plastic between agglomerates of nanoparticles, thereby giving rise to conductors which have both carbonized plastic and nanoparticles. In a special way, nanoparticles can also be excited by microwaves or ultrasonic waves in such a way that they form sheetlike conductor tracks which can advantageously be used as capacitor plates for passive components.

In the case of transparent plastics, two spaced-apart energy sources may be oriented in such a way that their focus regions are superimposed for the formation of conductors. This is particularly advantageous in the case of transparent plastics, especially as vertical conductors or conductors at a solid angle can then subsequently be realized there also within the volume of the regions made of plastic. In this case, it is possible firstly to produce at least one first plastic layer with completely embedded electrical components and with conductors, and afterward it is possible to stack further plastic layers—are arranged on the first layer—each with embedded further electrical components.

In this case, carbonization of the plastic with the aid of the superimposition of focus regions of two energy sources gives rise to conductors within the transparent plastic layers, conductors from layer to layer and conductors outward to external connections. At the ends of said outwardly directed connections, the carbonized plastic of the conductors can be metallized. On the other hand, it is possible to provide, instead of a pure carbonization of plastic, an agglomeration of nanoparticles in order to realize conductors made of metallic nanoparticles inwardly and outwardly.

To summarize, it is advantageous to introduce the chips into a clear, that is to say transparent, medium that can be carbonized by the supply of heat, such as a highly viscous casting resin, step by step. Afterward, the resin can be cured and the electrical contact connections can be produced by means of laser bombardment. The laser bombardment carbonizes the resin at the focal point of each laser beam. This gives rise to carbon black, which is electrically conductive. In order to reduce the structure width and the tolerances and also for faster carbonization without damaging the directly adjoining resin, a second laser beam is focused onto the same point.

In addition, the directly adjoining resin layer may be incipiently cured or cured in order thus to mechanically stabilize the "carbon black conductor track". Finally, a metallic external connection of the electronic device can be created outwardly by metallization of the carbon black. Consequently, the invention enables an arbitrary arrangement of electrical components and semiconductor chip in a synthetic resin and a three-dimensional wiring of the electrical components and semiconductor chips arranged in the synthetic resin. For the designer of complex circuit modules, this affords the advantage of a totally free configuration of the conductor network within the module and a totally free arrangement of the individual electrical components with corresponding electrical connections.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

The elements of the drawings are not necessarily to scale relative to each other. Like reference numerals designate corresponding similar parts.

FIG. 4 illustrates a schematic cross section through apparatus for production of a module with stacked electronic components of a fourth embodiment of the invention.

DETAILED DESCRIPTION

Figure 1:
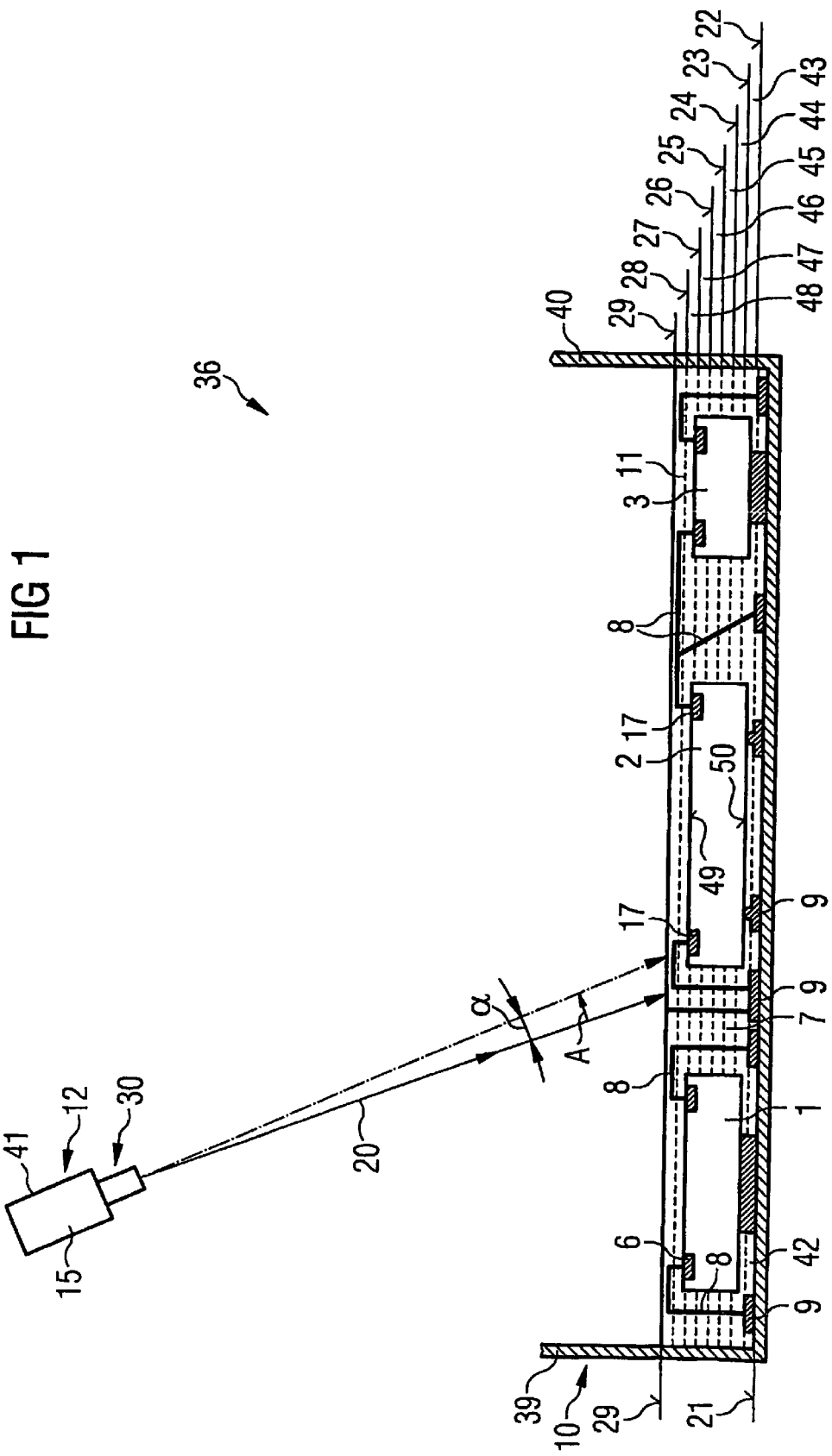
FIG. 1 illustrates a schematic cross section through apparatus for the production of an electronic device of a first embodiment of the invention.

FIG. 1 illustrates a schematic cross section through a device or apparatus 36 for the production of an electronic device of a first embodiment of the invention. The apparatus 36 has a casting mold 10 formed as a shallow trough. This shallow trough has a bottom level 21, from which the casting mold can be filled with synthetic resin. Furthermore, the upwardly open casting mold 10 has side walls 39 and 40. An energy source 12, which can supply a focusable beam 20, is arranged above the casting mold 10.

In this embodiment of the apparatus 36, the energy source 12 used is a laser apparatus 15 having a laser housing 41 and an orienting device 30 flanged onto the laser housing 41, by means of which the laser beam can be optically deflected over the entire bottom level, in which case a focusing device arranged in the orienting device 30 can adapt the focus of the laser apparatus to the distance between orienting device and bottom level and also the different casting levels 22 to 29 which result when the casting mold 10 is filled with synthetic resin. Furthermore, the apparatus 36 has a casting device (not illustrated), which fills the casting mold 10 with plastic continuously or layer by layer.

This casting device that is not illustrated may be a plastic dispensing device or a plastic spraying or plastic injecting device by means of which the plastic can be introduced into the casting mold 10 either continuously or layer by layer or level by level. Different electrical components 1, 2 and 3 can be introduced onto the bottom level. In the embodiment illustrated in FIG. 1, the electrical components are three semiconductor chips which are to be embedded in a plastic 11 and the contact areas 17 of which are disposed on the top sides 49. In this case, the rear sides 50 are to be connected to corresponding external contacts 9 of the electronic device to be formed.

In order to produce a device such as is illustrated in principle in the casting mold 10 in FIG. 1, firstly a first plastic layer 42 is applied on the bottom level 21 of the casting mold 10, the thickness of said first plastic layer being dimensioned in such a way that the focused laser beam 20 from the energy source 12 can fully carbonize this first plastic layer 42 from the first casting level 22 through to the bottom level 21. The remaining synthetic resin layers 43 to 48 are also dimensioned in terms of their thickness such that they can in each case be carbonized throughout by the focused laser beam 20.

In this embodiment of the invention, external contacts 9 are prepared by the carbonization of the first plastic layer on the bottom level 21 of the casting mold 10. As illustrated in FIG. 1, it is possible to provide areas of completely different sizes for said external contacts. This has particular advantages for the circuit design, with the result that the arrangement of the external contacts can be adapted to any device standard.

After such selective carbonization of the first layer, a second plastic layer 43 may be applied up to the casting level 23, which is again graded such that this layer 43 can also be fully contact-connected by means of carbonization with the aid of the laser beam 20. In this case, it is possible to retain the area of the external contacts of the first layer 42 or already to perform a reduction of the area size of the external contacts. After the carbonization of the first two layers 42 and 43, the electrical components 1, 2 and 3 illustrated here are applied by their rear sides 50 on this level 24.

This gives rise to large-area contact connections to the external contacts 9 of the components 1 and 3 or, as illustrated by the component 2, it is also possible to realize pointlike contact connections to the external contacts. By setting the viscosity of the second layer 43, the rear sides 50 can practically be fixed on this second plastic layer 43. The embedding of the edge sides of the semiconductor chips in the plastic composition then begins by application of the plastic layers 44 to 46. After the application of each of these plastic layers 44 to 46, the carbonization is continued locally and selectively where vertical conductors or conductors at an arbitrary solid angle are intended to arise, until the casting level 27 is reached, which has a common area with the active top sides 49 of the semiconductor chips.

A further layer 47 is applied to this area or on the level 27, in the case of which layer the conductors arranged vertically or at a solid angle are now not only continued but the plastic is also fully carbonized over the contact areas 17 of the semiconductor chips. The plastic layer 48 with the casting level 29 is then applied. Horizontal connecting conductors 8 to the vertical conductors or to the conductors 8 arranged at a solid angle and to the contact areas 17 are then realized in the plastic layer 48. In order to protect these carbonized conductors in the topmost layer 48, a further plastic layer (not illustrated) may be applied, or it is possible to further continue the conductor structure in the plastic and to construct further electronic components three-dimensionally over the casting level 29. The plastic 11 used in this embodiment is either a transparent plastic or a non-transparent plastic and may be enriched with nanoparticles. Since the layer sequence and the layer thickness of the plastic layers 42 to 48 are set with respect to full carbonization, for the method illustrated in FIG. 1 it is possible to use any plastic which can be carbonized or which can be agglomerated with nanoparticles, independently of its transparency.

Figure 2:
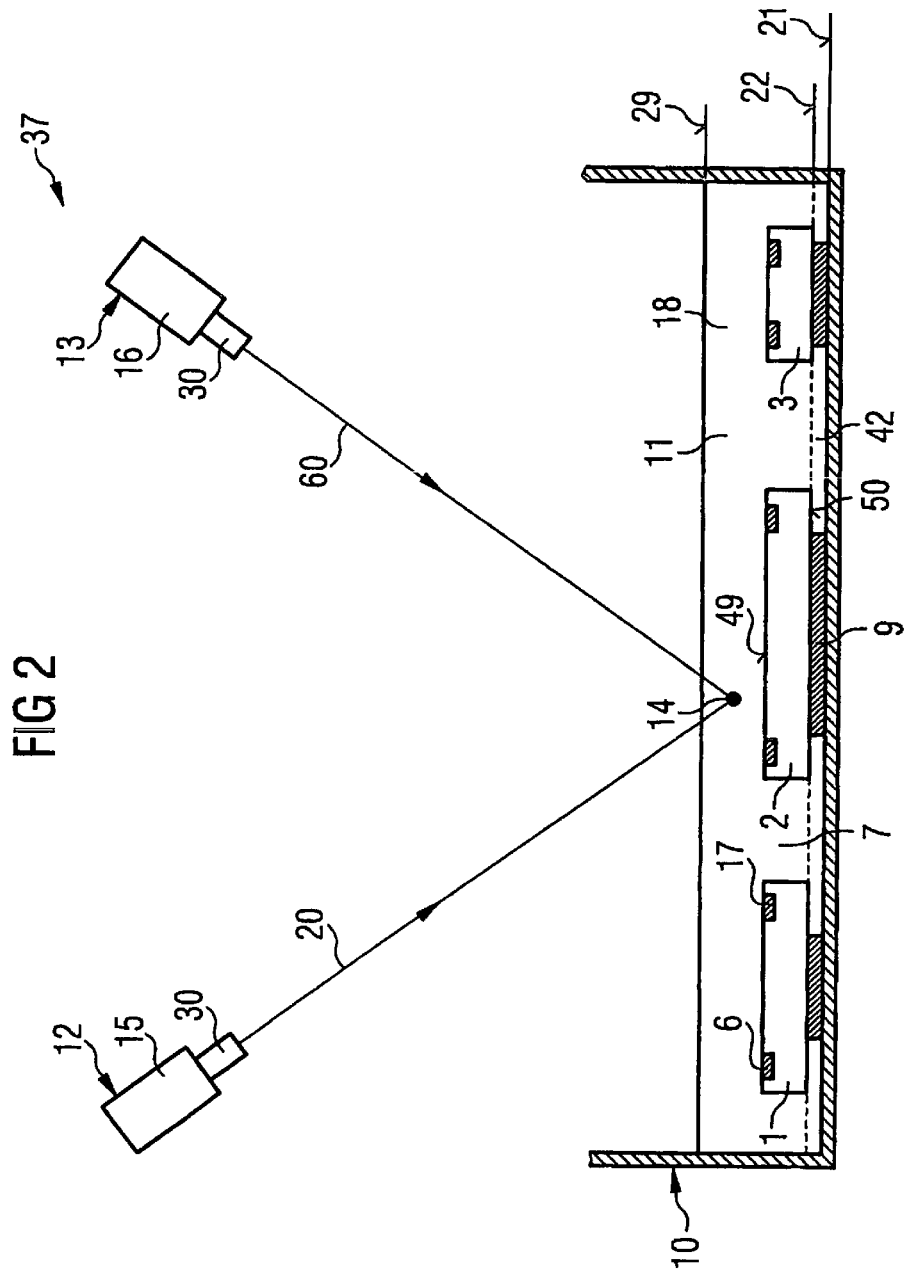
FIG. 2 illustrates a schematic cross section through apparatus in accordance with a second embodiment of the invention.

FIG. 2 illustrates a schematic cross section through an apparatus 37 in accordance with a second embodiment of the invention. Components having functions identical to those in FIG. 1 are identified by the same reference symbols and are not discussed separately. This apparatus 37 of the second embodiment of the invention has been developed in particular for wiring of electrical components with electrical connections which are to be packaged in a transparent plastic. For this purpose, the apparatus 37 has a second energy source 13, which is likewise provided by a laser apparatus 16. In this embodiment of the invention, the laser apparatus 16 is constructed in exactly the same way as the laser apparatus 15. The two laser apparatuses are arranged at a distance above the upwardly open casting mold 10. The two laser beams 20 and 60 overlap in their focus regions 14, which are oriented such that the common focus region can produce conductors made of carbonized plastic by carbonization within the region of the plastic. In this example, too, the electrical components that can be positioned in the casting mold 10 are realized by semiconductor chips. These semiconductor chips have contact areas 17 serving as electrical connections 6 on their active top sides 49.

In the case of this apparatus 37, it is possible using transparent plastic to provide substantially thicker layers made of plastic than in the first embodiment. The plastic layer 18 may already completely cover the electrical components. The individual focused laser beam 20 or 60 from the laser apparatuses 15 and 16, respectively, does not supply sufficient energy to initiate carbonization of the transparent plastic. Carbonization is possible, however, at the focal point 14 of the two laser apparatuses 15 and 16. The orienting devices 30 of the two laser apparatuses 15 and 16 result in the realization of a three-dimensional wiring by means of carbonized conductors in the substantially thicker layer 18 than the layers 42 to 48 of FIG. 1.

Firstly, however, in a manner similar to that in the first embodiment, a thin plastic layer 42 is applied to the bottom level 21 before the semiconductor chips are positioned by their rear sides 50 and the external contacts 9 which are intended to be contact-connected to the rear sides 50 of the semiconductor chips are prepared in this bottom layer 42. Afterward, the trough-type casting mold can be filled with a plastic layer 18 beyond the level of the active top sides 49. The residual non-carbonized plastic of the layer 42 and of the layer 18 is then available in order to realize a three-dimensional wiring between additional external contacts provided for the electronic device and the electrical connections 6 in the form of contact areas 17 of the semiconductor chips.

Figure 3:
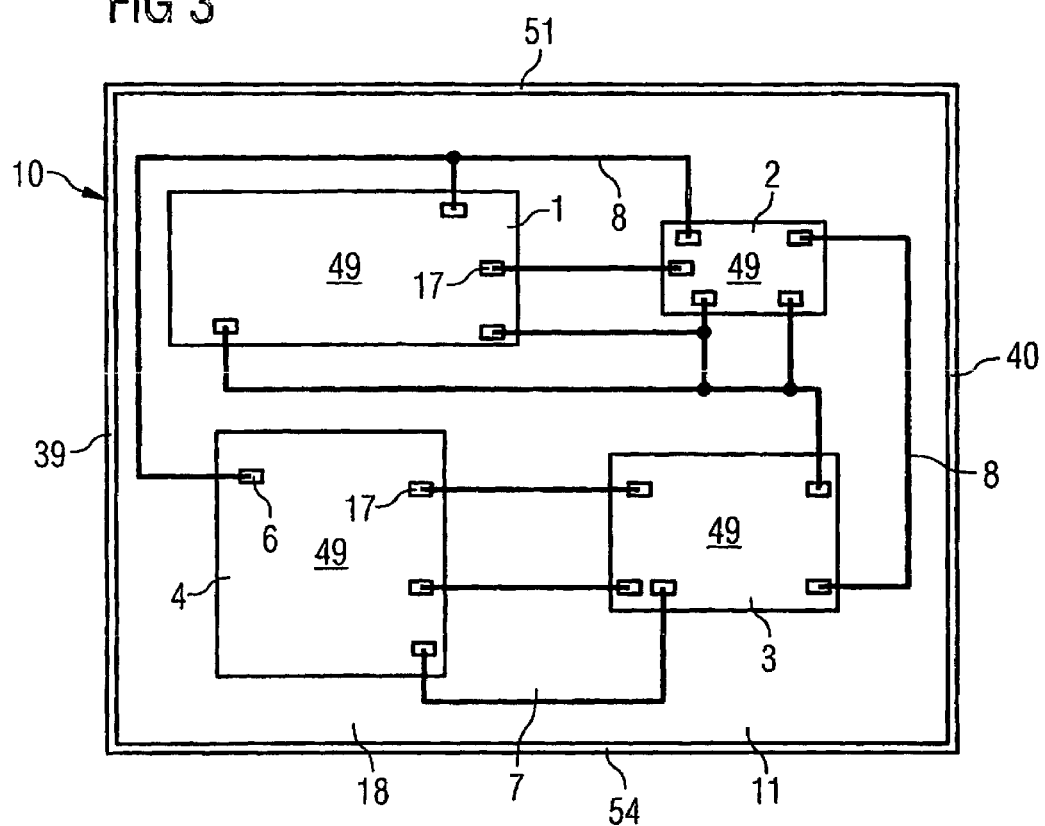
FIG. 3 illustrates a schematic plan view of a region in a device of a third embodiment of the invention.

FIG. 3 illustrates a schematic plan view of a region 7 of a third embodiment of the invention. This plan view is delimited by the casting mold 10 with its side walls 39, 40, 51 and 52. In this embodiment of the invention, four electrical components 1 to 4 in the form of four semiconductor chips of different sizes are arranged in a transparent plastic layer 18, their electrical connections 6 in the form of contact areas 17 being interconnected via carbonized conductors 8. Both the arrangement of the connections 6 on the active top sides 49 of the semiconductor chips and the routing of the horizontal conductors made of carbonized plastic or made of agglomerated nanoparticles or made of a combination of the two can be configured totally freely. This illustration according to FIG. 3 presupposes that the plastic 11 is transparent, so that the course of the conductors 8 and also the arrangement of the four semiconductor chips and their contact areas 17 are visible even though they are arranged in different levels.

FIG. 4 illustrates a schematic cross section through a apparatus 38 for the production of a module having stacked electrical components 1 to 5 of a fourth embodiment of the invention. A transparent plastic 11 was used in this embodiment of the invention, too. The casting mold 10 has higher side walls 39 and 40 than the embodiments of the previous figures. These higher side walls 39 and 40 make it possible to produce a stack of three plastic layers 18, 19 and 42.

Two laser apparatuses 15 and 16 are provided for this device 38, too. These laser apparatuses 15 and 16 differ from the laser apparatuses in the previous embodiments by virtue of the fact that separate orienting devices 30 and 31 having planar tilting mirrors 32 and 33 are provided. Said tilting mirrors 32 and 33 are tilted by the angles $\beta/2$ and $\gamma/2$, respectively, in order to cause the laser beams 20 and 60, respectively, to be rotated by the angles $\beta$ and $\gamma$, respectively. In this case, the common focal point 14 describes a conductor 53 which, by way of example, produces a connection between one of the contact areas 17 of the electrical component 5 and a connection 6 of the component 4.

In order to produce such a complex structural device in the form of a module having a plurality of components which are in part stacked one above the other, firstly a thin layer 42 is applied on the bottom level 21 of the casting mold 10, as in the previous embodiments. Said thin layer is fully carbonized at the locations at which external connections 9 are to be provided. Afterward, the lower layer including electrical components 1, 2 and 3 is applied to the level 22 of the layer 42 and the casting mold 10 is filled with transparent plastic 11 up to the casting level 34.

The region 7 of the layer 18 is provided with conductors with the aid of the laser apparatuses 15 and 16. Afterward, further components 4, 5 may be introduced into the casting mold 10 onto the level 34 at envisaged locations and once again be embedded in a thick transparent plastic layer 19 up to the casting level 35. The thicknesses of the layers 18 and 19 are between 500 μm and 2000 μm. Moreover, as many layers 18 and 19 as desired can be stacked one above the other, so that entire module blocks can be produced inexpensively.

After the application of the transparent layer 19, the conductive connections in the form of conductors 8 are then introduced into the region 7 of the second thick transparent layer 19. The conductor tracks 8, which here are for the most part illustrated in a vertical or horizontal direction, may also be realized at any arbitrary solid angle in order to ensure optimum and short connecting paths.

In order to guide the focal point 14 along the conductor 53, the laser beams 20 and 60 are pivoted synchronously by the angles $\beta$ and $\gamma$, respectively. For this purpose, the tilting mirrors 32 and 33 are pivoted about their pivots 54 in the direction b and c, respectively, while the laser beams change their direction in B and C, respectively.

The invention claimed is:

1. A method for the production of an electronic device comprising at least one electrical component having electrical connections, the method comprising:
   arranging the electrical component in a casting mold for plastic;
   introducing plastic into the casting mold to at least partially embed the electrical component; and
   partial carbonization of the plastic and/or partial agglomeration of nanoparticles in the plastic to form conductors in a region by means of radiating in energy of a focused and guided beam from an energy source.

2. The method of claim 1, comprising firstly producing at least one plastic layer with embedded electrical components and with conductors, and afterward further plastic layers with embedded electrical components are realized, the further plastic layers being arranged on the first layer, whereby conductors are produced within the layers and from layer to layer by carbonization of the plastic and/or by agglomeration of nanoparticles in the respective plastic layer.

3. The method of claim 2, comprising wherein conductors are produced from the connections of the component to external connections of the electronic device.

4. The method of claim 1, comprising wherein conductors are produced from the connections of the component to external connections of the electronic device.

5. The method of claim 1, comprising effecting the two spaced-apart energy sources in such a way that their focus regions are superimposed for the formation of conductors.

6. The method of claim 1, comprising effecting the introduction of energy for the formation of conductors by means of microwave excitation or by means of electromagnetic radiation or by means of ultrasonic radiation.

* * * * *